(12) United States Patent
Jin et al.

(10) Patent No.: US 8,189,394 B2
(45) Date of Patent: May 29, 2012

(54) PAGE BUFFER CIRCUIT OF NONVOLATILE MEMORY DEVICE AND METHOD OF OPERATING THE SAME

(75) Inventors: Hyun Jong Jin, Seoul (KR); Jin Haeng Lee, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 339 days.

(21) Appl. No.: 12/647,725

(22) Filed: Dec. 28, 2009

(65) Prior Publication Data
US 2010/0214849 A1      Aug. 26, 2010

(30) Foreign Application Priority Data

Feb. 26, 2009  (KR) ........................ 10-2009-0016315

(51) Int. Cl.
*G11C 16/06* (2006.01)
(52) U.S. Cl. ......... 365/185.22; 365/189.05; 365/185.12; 365/185.21
(58) Field of Classification Search ............. 365/185.22, 365/189.05, 185.12, 185.21, 185.25
See application file for complete search history.

(56) References Cited

U.S. PATENT DOCUMENTS
7,180,783 B2 * 2/2007 Kim et al. ................ 365/185.22

FOREIGN PATENT DOCUMENTS
KR    1020090002621    1/2009

OTHER PUBLICATIONS

Notice of Allowance issued from Korean Intellectual Property Office on Nov. 30, 2010.

* cited by examiner

*Primary Examiner* — David Lam
(74) *Attorney, Agent, or Firm* — IP & T Group LLP

(57) ABSTRACT

The page buffer of a nonvolatile memory device utilizing a double verification method using first and second verification voltages when performing a program verification operation includes a first latch unit including a first latch configured to store input data and results of a program operation and a first verification operation using the first verification voltage, and a second latch unit including a second latch configured to have a higher latch trip point than the first latch and to store a result of a second verification operation using the second verification voltage, which is less than the first verification voltage, when the first verification operation is performed.

8 Claims, 9 Drawing Sheets

ND METHOD OF
PAGE BUFFER CIRCUIT OF NONVOLATILE MEMORY DEVICE AND METHOD OF OPERATING THE SAME

CROSS-REFERENCE TO RELATED APPLICATION

Priority to Korean patent application number 10-2009-0016315 filed on Feb. 26, 2009, the entire disclosure of which is incorporated by reference herein, is claimed.

BACKGROUND

Exemplary embodiments relate to a nonvolatile memory device and, more particularly, to the page buffer circuit of a nonvolatile memory device and a method of operating the same, where the latches of a page buffer can store two verification results for one verification voltage.

A nonvolatile memory device may include a memory cell array, a row decoder, a page buffer unit, etc. The memory cell array may include a plurality of word lines elongated in rows, a plurality of bit lines elongated in columns, and a plurality of cell strings corresponding to the respective bit lines.

The row decoder, coupled to string selection lines, word lines, and a common source line, may be placed on one side of the memory cell array. Page buffers coupled to the plurality of bit lines are placed on the other side of the memory cell array.

Recently, to further increase the degree of integration of nonvolatile memory devices, active research is being done on a multi-bit cell which is able to store plural bits of data in a single memory cell. This type of a memory cell is called a multi-level cell (MLC). A memory cell capable of storing one bit is called a single level cell (SLC).

In the nonvolatile memory device, the number of latches for storing data when data are sensed or programmed is gradually increasing.

Furthermore, in a nonvolatile memory device using MLCs, it is important to narrow a distribution of the threshold voltages of the cells. To control the distribution of the threshold voltages, a variety of operation options, such as a double verification operation and a re-program operation, are being used, which increases the number of cases for performing a program operation.

In particular, in the case in which the double verification operation is performed, operations, such as precharging a bit line and sensing, are repeatedly performed in order to perform two verification operations using two verification voltages. Accordingly, the time that it takes to perform the verification operations is increased, leading to an increased time taken for a program operation to be executed.

BRIEF SUMMARY

One or more embodiments relate to a method of operating a nonvolatile memory device, which is capable of reducing the time taken for a program operation to be executed by reducing the time taken for a double verification operation to be executed.

According to an aspect of this disclosure, there is provided a page buffer of a nonvolatile memory device utilizing a double verification method using first and second verification voltages when performing a program verification operation, the page buffer including a first latch unit including a first latch configured to store input data for a program operation and results of a first verification operation using the first verification voltage, and a second latch unit including a second latch configured to have a higher latch trip point than the first latch and to store a result of a second verification operation using the second verification voltage, which is less than the first verification voltage, when the first verification operation is performed.

The first latch unit includes the first latch configured to comprise first and second inverters respectively having a PMOS transistor and an NMOS transistor having a same channel size between first and second nodes, and first and second switching elements configured to select the first node or the second node in order to change data stored in the first latch.

The second latch unit includes the second latch configured to comprise third and fourth inverters respectively having a PMOS transistor and an NMOS transistor between third and fourth nodes and third and fourth switching elements configured to select the third node or the fourth node in order to change data stored in the second latch. Here, the PMOS transistor of the second latch has a same channel size as the PMOS transistor of the first latch, and the NMOS transistor of the second latch has a larger channel size than the PMOS transistor of the second latch.

The second latch is configured to have a higher latch trip point than the first latch as high as a voltage level corresponding to a difference between the first verification voltage and the second verification voltage.

According to another aspect of this disclosure, there is provided a page buffer of a nonvolatile memory device utilizing a double verification method using first and second verification voltages when performing a program verification operation, the page buffer including a first latch unit, including a first latch configured to store data and a first data sense unit turned on or off in response to a voltage level of a sense node which is changed according to a result of a first verification operation using the first verification voltage, and a second latch unit, including a second latch configured to store data and a second sense unit turned on or off in response to a voltage level of the sense node and operated in response to a lower voltage level than that of the first data sense unit.

The first and second data sense units include first and second NMOS transistors, respectively. The gates of the first and second NMOS transistors are coupled to the sense node. The second NMOS transistor has a larger channel size than the first NMOS transistor.

According to yet another aspect of this disclosure, there is provided a method of operating a nonvolatile memory device, the memory device including a memory cell array configured to have memory cells coupled together by bit lines and word lines and page buffers coupled to the bit lines, including performing a program operation on a selected memory cell selected from among the memory cells in response to a program pulse, precharging a selected bit line coupled to the selected memory cell, applying a first verification voltage to a selected word line coupled to the selected memory cell and changing a voltage of the selected bit line according to a program state of the selected memory cell, coupling the selected bit line and a sense node of a page buffer coupled to the selected bit line and changing a voltage level of the sense node according to the voltage of the selected bit line, and storing a result of a verification operation using the first verification voltage and a result of a verification operation using a second verification voltage lower than the first verification voltage in first and second latches of a page buffer having first and second latch trip points, respectively, according to the voltage level of the sense node.

The second latch trip point is higher than the first latch trip point by a difference between the first and second verification voltages.

DESCRIPTION OF EMBODIMENTS

Hereinafter, exemplary embodiments of the present disclosure will be described in detail with reference to the accompanying drawings. The figures are provided to allow those having ordinary skill in the art to understand the scope of the embodiments of the disclosure.

Figure 1A:
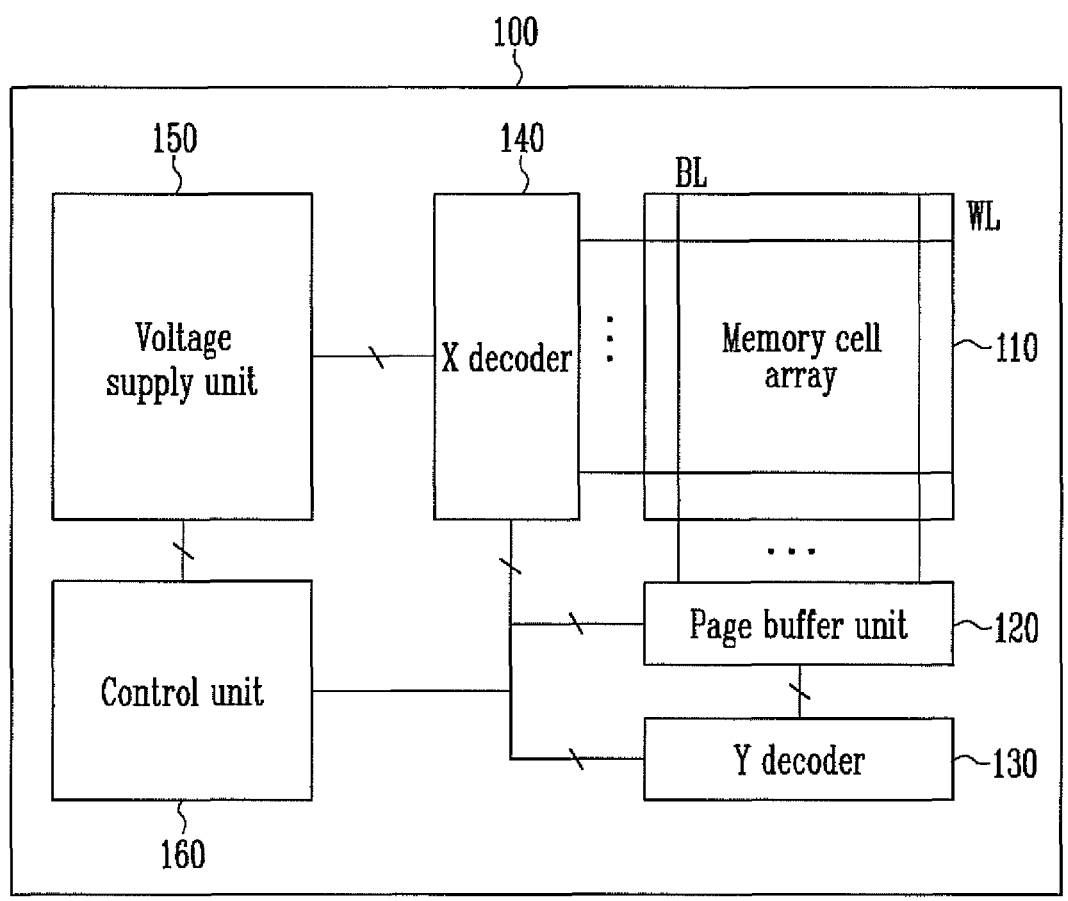
FIG. 1A is a block diagram of a nonvolatile memory device.

FIG. 1A a block diagram of a nonvolatile memory device.

Referring to FIG. 1A, the nonvolatile memory device 100 includes a memory cell array 110, a page buffer unit 120, a Y decoder 130, an X decoder 140, a voltage supply unit 150, and a control unit 160.

The memory cell array 110 includes memory cells for storing data. The memory cells form memory blocks coupled together by bit lines and word lines. Here, each memory cell is an MLC capable of storing data of 2 bits.

The page buffer unit 120 includes page buffers PB. The page buffers PB each are coupled to one or more bit lines and configured to latch data to be programmed into a selected memory cell or to store data read from a selected memory cell.

The Y decoder 130 is configured to provide a data 10 path to the page buffers PB. The X decoder 140 is configured to select a memory block and to couple the word lines of a selected memory block with global word lines for providing operating voltages.

The voltage supply unit 150 is configured to generate the operating voltages for program, erase, and read operations and to supply them to the global word lines.

The control unit 160 is configured to control the program, erase, and read operations. Further, when performing a double verification operation, the control unit 160 controls the page buffers PB, such that two verification operations using one verification voltage are possible through control of a latch timing in each verification operation.

Figure 1B:
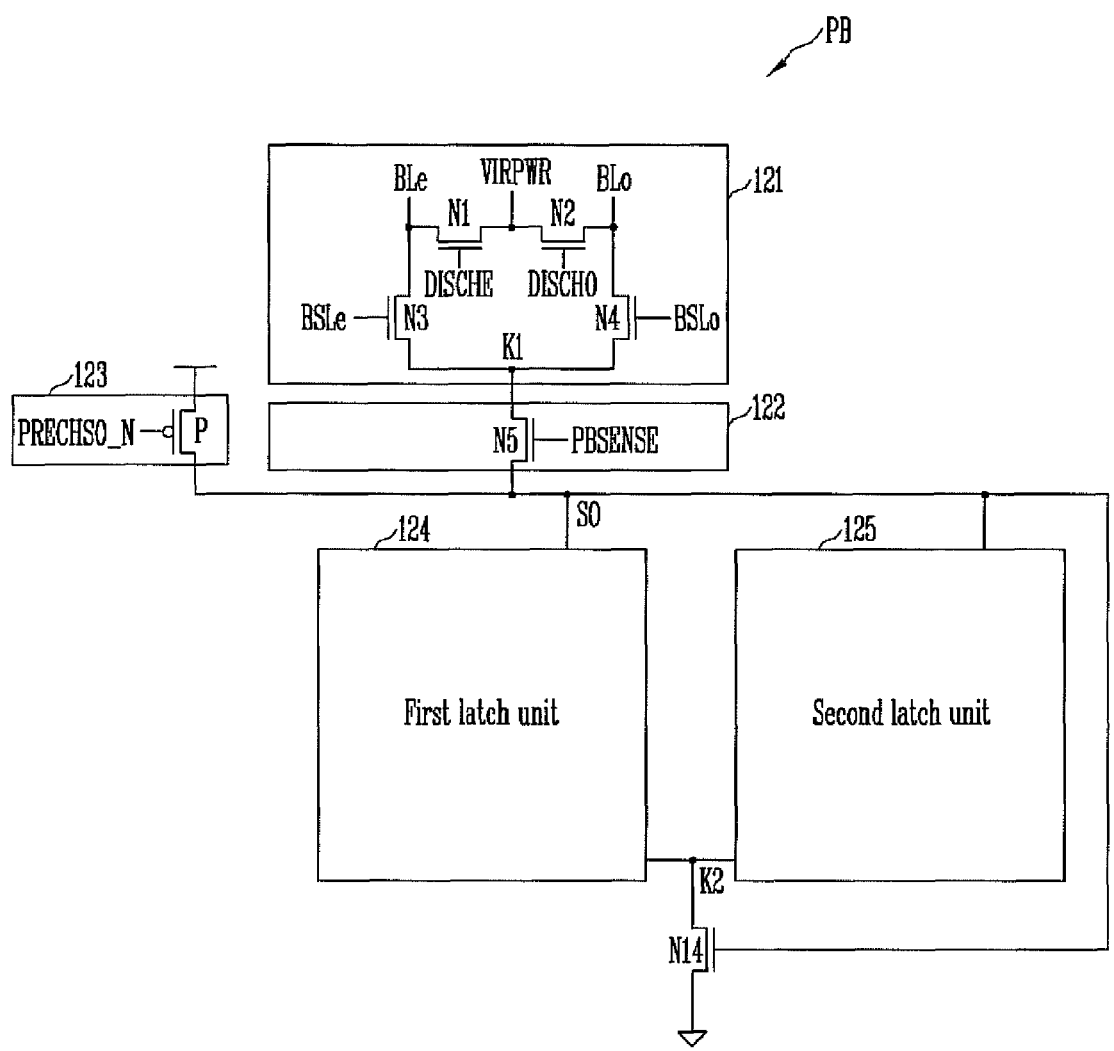
FIG. 1B is a circuit diagram of a page buffer of the page buffer unit shown in FIG. 1A.

FIG. 1B is a circuit diagram of a page buffer of the page buffer unit shown in FIG. 1A.

Referring to FIG. 1B, each of the page buffers PB includes a bit line selection unit 121, a sense unit 122, a precharge unit 123, a first latch unit 124, and a second latch unit 125.

The bit line selection unit 121 is coupled with an even bit line BLe and an odd bit line BLo and configured to couple a bit line, selected by the control unit 160, with the sense unit 122. The sense unit 122 is configured to change the voltage level of a sense node SO according to voltage of the coupled bit line and to sense data.

The precharge unit 123 is configured to precharge the sense node SO to a power supply voltage level. The first and second latch units 124, 125 are configured to store data according to the voltage level of the sense node SO.

The first latch unit 124 is configured to latch data to be programmed, and to transfer stored data, when a program operation is performed, to a bit line via the sense node SO, such that the data can be programmed into a memory cell. Furthermore, when a typical verification operation or a data read operation is performed, the first latch unit 124 senses data stored in a memory cell and stores the sensed data.

The second latch unit 125 has a higher latch trip point for latching data than the first latch unit 124. Thus, the second latch unit 125 allows its latched data to be changed even for a small shift in current when a small sense operation is performed. The latch trip point is described in detail later with reference to FIG. 1C.

The bit line selection unit 121 includes first to fourth NMOS transistors N1 to N4. The sense unit 122 includes a fifth NMOS transistor N5. The precharge unit 123 includes a first PMOS transistor P.

The first and second NMOS transistors N1, N2 are coupled in series between the even bit line and the odd bit line. An even discharge control signal DISCHE is inputted to the gate of the first NMOS transistor N1, and an odd discharge control signal DISCHO is inputted to the gate of the second NMOS transistor N2.

A variable voltage VIRPWR is inputted to an intervening node between the drain of the first NMOS transistor N1 and the source of the second NMOS transistor N2.

The third NMOS transistor N3 is coupled between the even bit line BLe and a node K1, and the fourth NMOS transistor N4 is coupled between the odd bit line no and the node K1. An even bit line selection signal BSLe is inputted to the gate of the third NMOS transistor N3, and an odd bit line selection signal BSLo is inputted to the gate of the fourth NMOS transistor N4.

The fifth NMOS transistor N5 is coupled between the node K1 and the sense node SO. A sense control signal PBSENSE is inputted to the gate of the fifth NMOS transistor N5.

The first PMOS transistor P is coupled between a power supply voltage and the sense node SO. A precharge control signal PRECHSO_N is inputted to the gate of the PMOS transistor P.

The first and second latch units 124, 125 are coupled to the sense node SO. The second latch unit 125 is configured to have a higher latch trip point than the first latch unit 124.

A method of making the latch trip points of the first and second latch units 124, 125 different can be achieved by making the sizes of inverters constituting the latch circuit different or by using different types of transistors in order to change data of the latch circuit through the sense node SO.

Figure 1C:
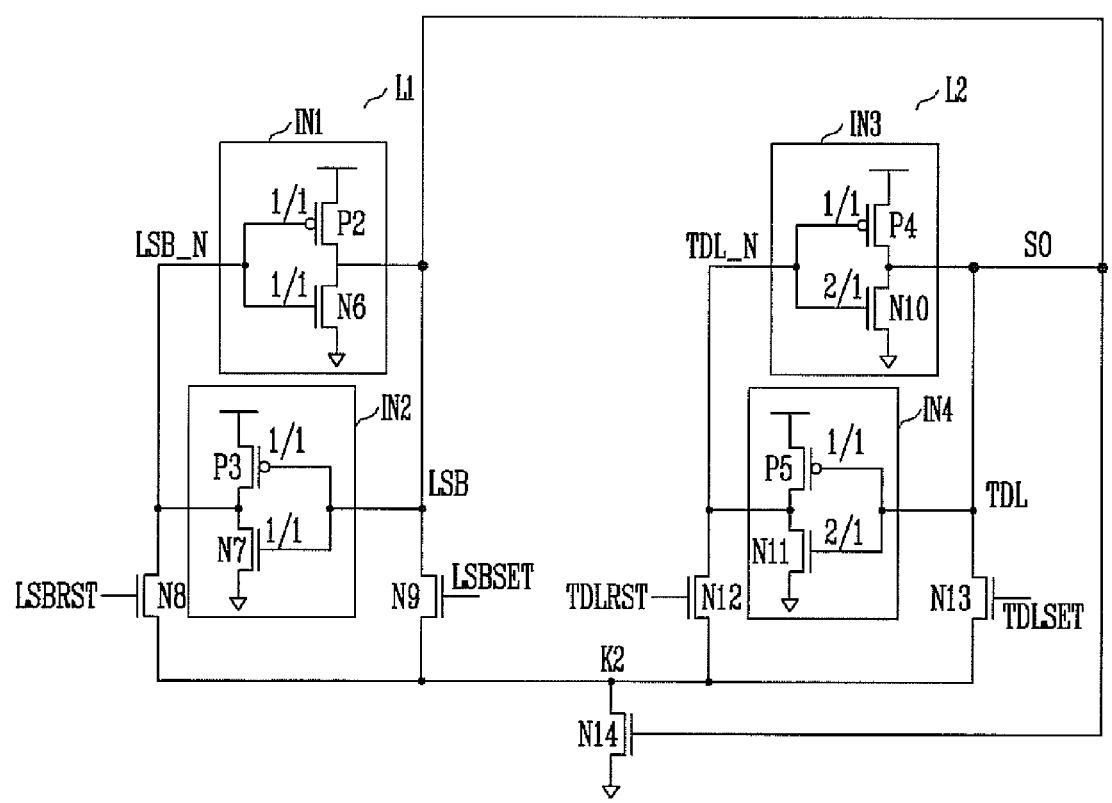
FIG. 1C is a circuit diagram of a latch unit according to a first embodiment.

FIG. 1C is a circuit diagram of the latch unit according to a first embodiment.

Referring to FIG. 1C, in the first embodiment of this disclosure, the sizes of inverters constituting latch circuits are different, such that the latch circuits have different latch trip points.

FIG. 1C shows a diagram of the first latch L1 and the second latch L2, in more detail, at the level of transistors.

Referring to FIG. 1C, the first latch L1 includes first and second inverters IN1, IN2 coupled between a node LSB and a node LSB_N.

The first inverter IN1 includes a second PMOS transistor P2 and a sixth NMOS transistor N6. The second inverter IN2 includes a third PMOS transistor P3 and a seventh NMOS transistor N7.

The second and third PMOS transistors P2, P3 and the sixth and seventh NMOS transistors N6, N7 have the same channel size (for example, each transistor has a width/length ratio of 1/1). An eighth NMOS transistor N8 is coupled between the node LSB_N and a node K2. A ninth NMOS transistor N9 is coupled between the node LSB and the node K2.

An LSB reset signal LSBRST is inputted to the gate of the eighth NMOS transistor N8, and an LSB set signal LSBSET is inputted to the gate of the ninth NMOS transistor N9.

The second latch L2 includes third and fourth inverters IN3, IN4 coupled between a node TDL_N and a node TDL.

The third inverter IN3 includes a fourth PMOS transistor P4 and a tenth NMOS transistor N10. The fourth inverter IN4 includes a fifth PMOS transistor P5 and an eleventh NMOS transistor N11.

A twelfth NMOS transistor N12 is coupled between the node TDL_N and the node K2. A thirteenth NMOS transistor N13 is coupled between the node TDL and the node K2.

A TDL reset signal TDLRST is inputted to the gate of the twelfth NMOS transistor N12. A TDL set signal TDLSET is inputted to the gate of the thirteenth NMOS transistor N13.

The fourteenth NMOS transistor N14 is coupled between the node K2 and a ground node. The gate of the fourteenth NMOS transistor N14 is coupled to the sense node SO.

Data of the first or second latch L1 or L2 can be changed according to the turn-on state of the fourteenth NMOS transistor N14. Furthermore, a data change node of the first and second latches L1, L2 can be selected according to the input of the LSB reset signal LBRST or the LSB set signal LSBSET and a TDL reset signal TDLRST or a TDL set signal TDLSET.

Meanwhile, in the second latch L2, the tenth and eleventh NMOS transistors N10, N11 have a larger channel size than the fourth and fifth PMOS transistors P4, P5, respectively. In FIG. 1C, it is shown that the fourth and fifth PMOS transistor P4, P5 have the channel size width/length ratio of 1/1, while the tenth and eleventh NMOS transistors N10, N11 have the channel size width/length ratio of 2/1.

In view of the characteristic of an NMOS transistor, the threshold voltage of the NMOS transistor is lowered with an increase in the size of the channel. That is, the tenth and eleventh NMOS transistors N10, N11 are turned on with a lower voltage than the sixth and seventh NMOS transistors N6, N7 of the first latch L1.

In the second latch L2, when a voltage level at which the tenth or eleventh NMOS transistor N10 or N11 is turned on is low, it means that latched data can be changed with a low input voltage (i.e., a low latch trip point).

The latch trip point is described in more detail below by comparing the first latch L1 and the second latch L2.

The latch circuit, such as the first latch L1, is coupled between the node LSB and the node LSB_N. When data are inputted to one of the node LSB and the node LSB_N, data inputted to the other of the node LSB and the node LSB_N are changed into data opposite to the data inputted to one of the node LSB and the node LSB_N. The inputted data are retained by the first and second inverters IN1, IN2.

Here, if, as in the first latch L1, the transistors constituting the first and second inverters IN1, IN2 have the same channel size, data are changed according to the same voltage level irrespective of data inputted thereto.

For example, when the state of data stored in the node LSB is '0', the state of data stored in the node LSB_N is '1'.

Further, if data '0' are forcibly inputted to the node LSB_N, the state of the data stored in the node LSB is automatically changed into '1'.

For another example, when the state of data stored in the node LSB is '1', if data '0' are forcibly inputted to the node LSB, the state of data stored in the node LSB_N is automatically changed from '0' to '1'.

Here, the voltage level at which data '0' or data '1' is inputted to the node LSB and the voltage level at which data '0' or data '1' is inputted to the node LSB_N are identical. For example, assuming that if a voltage of 3 V or more is applied, the state of data stored in the node LSB or LSB_N is changed to '1', and if voltage of 3 V or less is applied, the state of data stored in the node LSB or LSB_N is changed to '0', then it is said that the data stored in the node LSB or the node LSB_N can be changed on the basis of 3 V. Here, the voltage 3 V is a latch trip point, which indicates a voltage level at which data are changed.

Meanwhile, in the second latch L2, even though 3 V is not inputted, the tenth or eleventh NMOS transistor N10 or N11 can be turned on. Accordingly, data latched in the second latch L2 can be changed using a lower voltage level as compared with the first latch L1. The same principle applies to the amount of current.

Accordingly, a degree in which the fourteenth NMOS transistor N14 is turned on is changed according to the voltage level of the sense node SO, and so the amount of current flowing through the node K2 is changed. Latch trip points where data stored in the first latch L1 and the second latch L2, having different latch trip points, are changed according to the amount of current.

Alternatively, the latch trip point can be changed by controlling the size of the transistor for sensing the voltage level of the sense node SO, as opposed to the size of the transistors constituting the latch circuit.

Figure 1D:
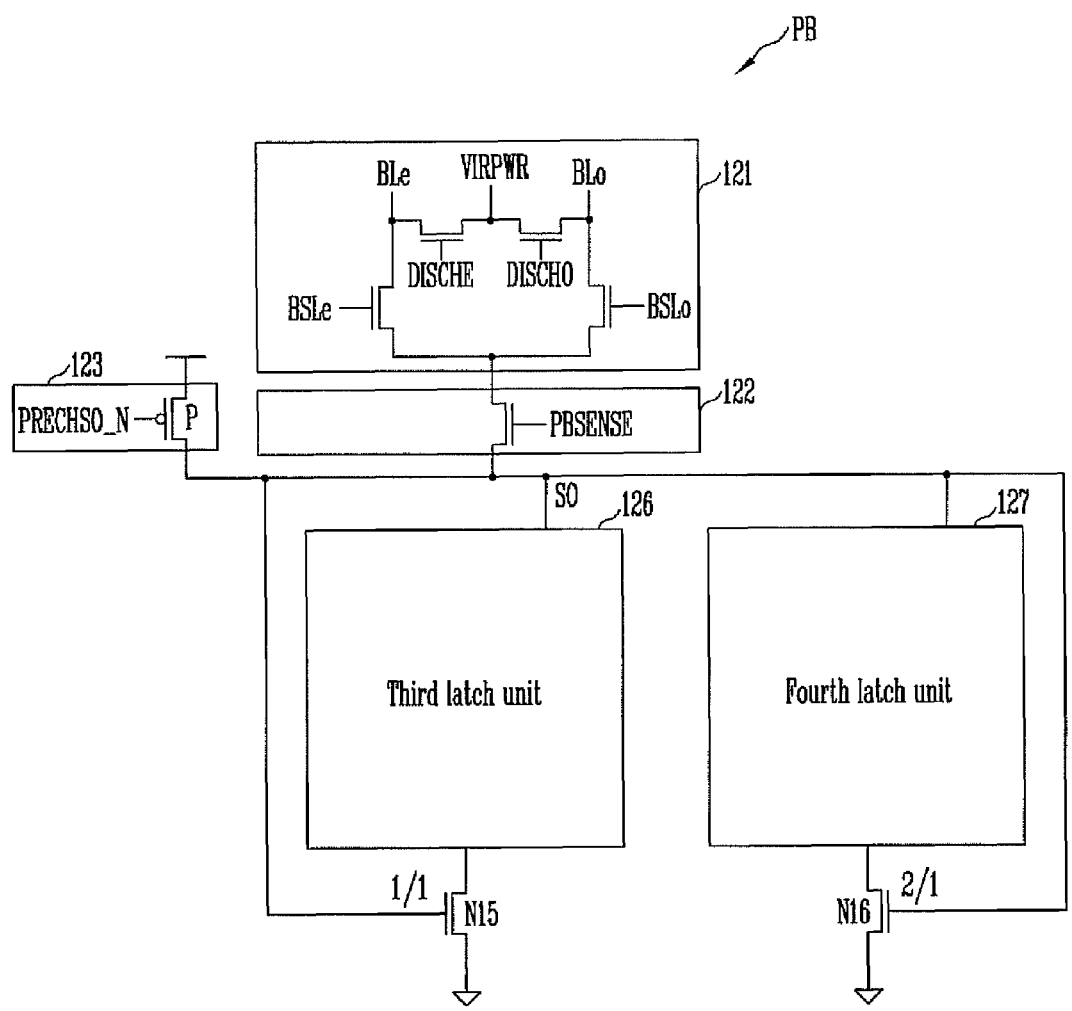
FIG. 1D is a circuit diagram of a page buffer according to a second embodiment.

FIG. 1D is a circuit diagram of a page buffer according to a second embodiment.

Referring to FIG. 1D, the page buffer PB of the second embodiment is similar in construction to that of the first embodiment except that third and fourth latch units 126, 127 are respectively coupled to fifteenth and sixteenth NMOS transistors N15, N16. Here, the fifteenth and sixteenth NMOS transistors N15, N16 respectively function as second and third sense units for sensing the voltage level of the sense node SO.

Figure 1E:
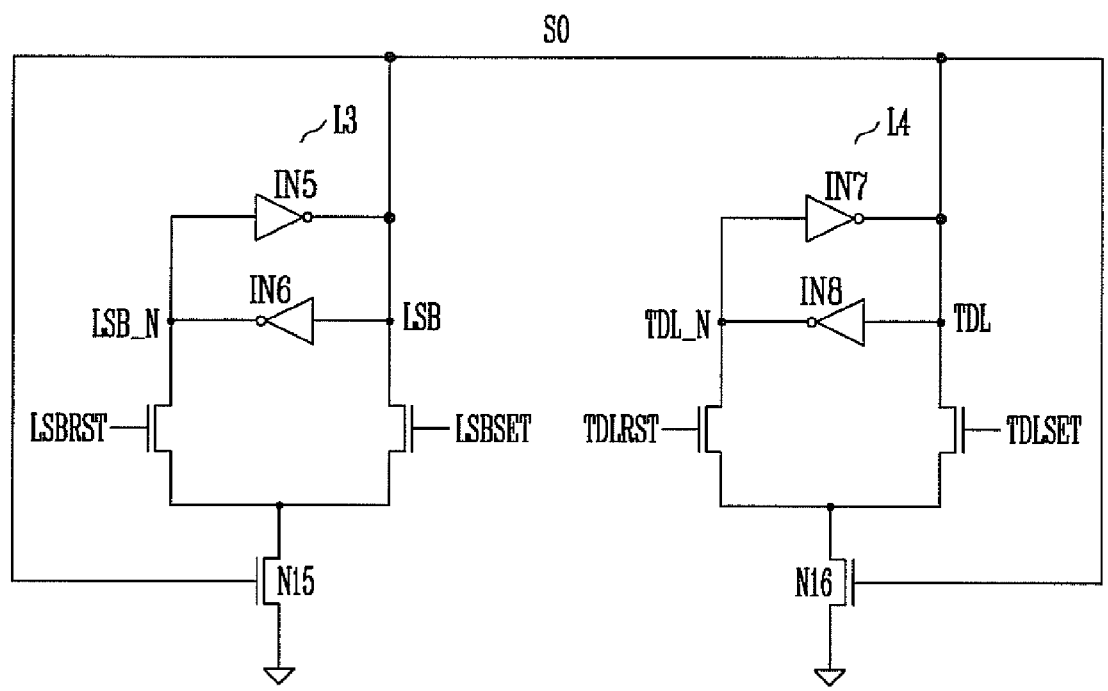
FIG. 1E is a circuit diagram of the third and fourth latch units shown in FIG. 1D.

FIG. 1E is a circuit diagram of the third and fourth latch units 126, 127 shown in FIG. 1D.

Referring to FIG. 1E, the third latch unit 126 and the fourth latch unit 127 respectively include third and fourth latches L3, L4 for latching data. Each of the third and fourth latch units 126, 127 includes transistors on opposite sides, as shown in FIG. 1C, in order to change data latched in each of the third and fourth latches L3, L4.

The third latch unit 126 and the fourth latch unit 127 are respectively coupled to the fifteenth NMOS transistor N15 and the sixteenth NMOS transistor N16. The fifteenth NMOS transistor N15 is configured to sense the voltage level of the sense node SO, and to change data stored in the third latch L3. The sixteenth NMOS transistor N16 is configured to sense the voltage level of the sense node SO, and to change data stored in the fourth latch L4.

For example, the fifteenth NMOS transistor N15 can have a channel size width/length ratio of 1/1, and the sixteenth NMOS transistor N16 can have a channel size width/length ratio of 2/1. Thus, the fifteenth and sixteenth NMOS transistors N15, N16 can be designed to have different voltage levels at which they are turned on.

Consequently, the latch trip points at which data stored in the third and fourth latches L3, L4 are changed differ.

Since the sixteenth NMOS transistor N16 has a larger channel size than the fifteenth NMOS transistor N15, it is turned on at a lower voltage level than the fifteenth NMOS transistor N15.

A point of time at which the fifteenth or sixteenth NMOS transistor N15 or N16 is turned on refers to a point of time at which data stored in the third or fourth latch L3 or L4 are changed. Consequently, the third and fourth latches L3, L4 have different latch trip points.

Figure 2:
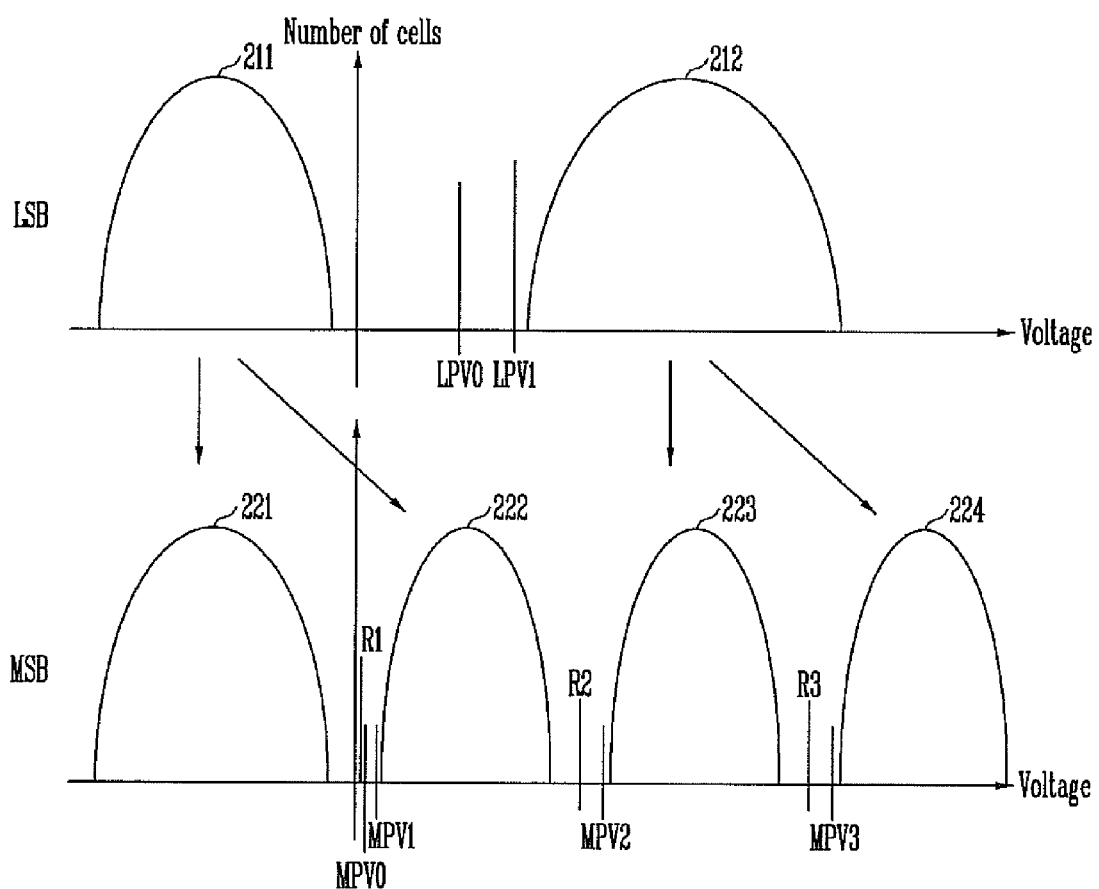
FIG. 2 is a diagram showing distributions of the threshold voltages of memory cells.

FIG. 2 is a diagram showing distributions of the threshold voltages of memory cells.

Referring to FIG. 2, in the case in which multi-level memory cells each capable of storing data of 2 bits are programmed, logical page programs, including a least significant bit (LSB) page program and a most significant bit (MSB) page program, are performed on one word line coupled with the memory cells.

When the LSB page program is performed on the word line, a distribution of the threshold voltages of the memory cells is divided into first and second threshold voltage distributions 211, 212. When the MSB page program is performed on the word line, the first and second threshold voltage distributions 211, 212 are respectively divided into third and fourth threshold voltage distributions 221, 222 and fifth and sixth threshold voltage distribution 223 to 224.

Here, a double verification operation using $0^{th}$ and first verification voltages MPV0, MPV1 is performed on memory cells having the fourth threshold voltage distribution 222. A verification operation is performed on memory cells having the fifth threshold voltage distribution 223 using a second verification voltage MPV2, and a verification operation is performed on memory cells having the sixth threshold voltage distribution 224 using a third verification voltage MPV3.

Prior to a description of the double verification method using the page buffer circuit according to the first and second embodiments, a process of performing a double verification operation using an exemplary page buffer circuit is described.

Figure 3:
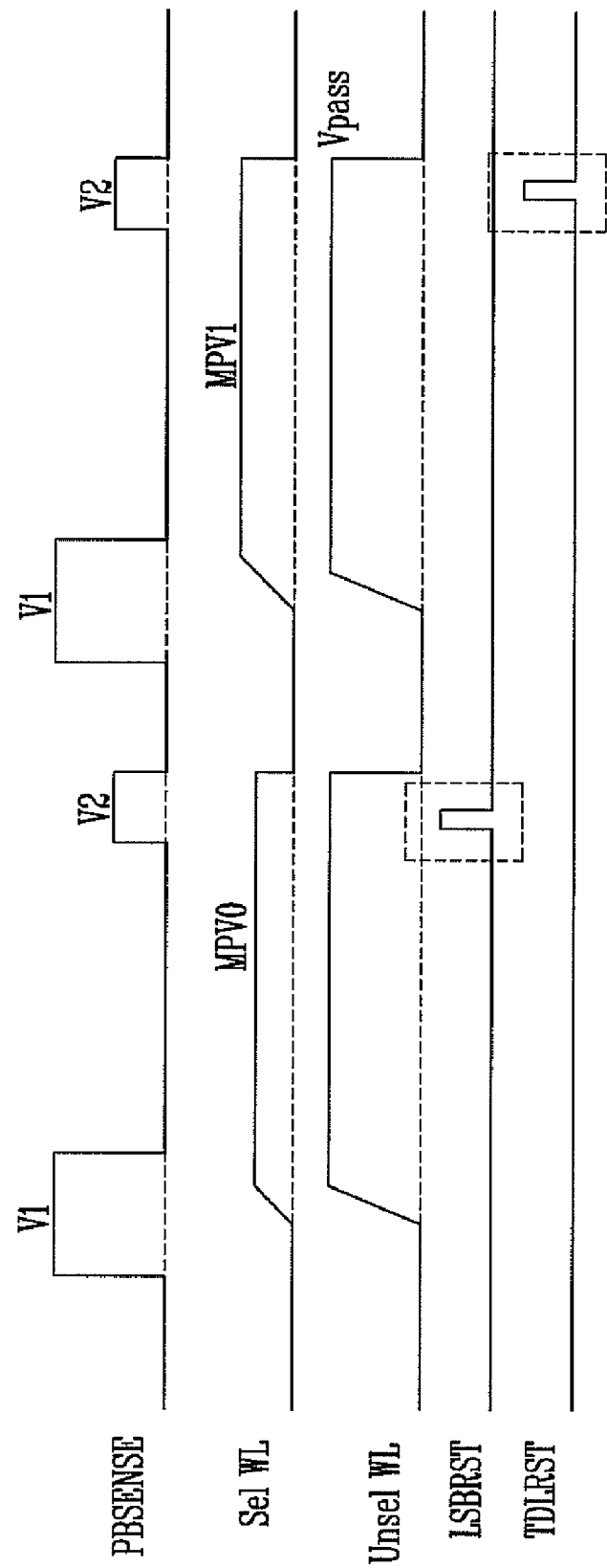
FIG. 3 is a timing diagram illustrating the double verification operation of an exemplary nonvolatile memory device.

FIG. 3 is a timing diagram illustrating the double verification operation of an exemplary nonvolatile memory device.

FIG. 3 shows a timing diagram of control signals when the double verification operation using the exemplary page buffer PB is performed. Here, the exemplary page buffer PB includes the first and second latch units 124, 125 having the same size inverters so as to have the same latch trip points. In other words, FIG. 3 shows the timing diagram assuming a verification operation is performed on a circuit similar to FIG. 1C with a difference that the first and second latch units 124, 125 have the same latch trip points.

Furthermore, the timing diagram of FIG. 3 shows a case in which, after the LSB page program has been completed in the threshold voltage distributions of FIG. 2, the double verification operation using the $0^{th}$ and first MSB verification voltages MPV0, MPV1 is performed.

After a program operation is performed on a selected memory cell in response to an MSB program pulse, the sense node SO is precharged in order to perform the verification operation using the $0^{th}$ MSB verification voltage MPV0.

To this end, the precharge control signal PRECHSO_N of a low level is applied to turn on the first PMOS transistor P1. When the first PMOS transistor P1 is turned on, the sense node SO is precharged to the power supply voltage level.

Next, the even bit line selection signal BSLe of a high level is applied to turn on the third NMOS transistor N3, and the sense control signal PBSENSE of a first voltage level V1 is applied to the fifth NMOS transistor N5, thereby coupling the even bit line BLe and the sense node SO together. Accordingly, the bit line BLe is precharged.

After the bit line BLe is precharged, the sense control signal PBSENSE is set to 0 V, thus floating the bit line BLe and the sense node SO.

Next, the $0^{th}$ MSB verification voltage MPV0 is applied to a selected word line Sel WL, and a pass voltage Vpass is applied to unselected word lines Unsel WL. Accordingly, the voltage of a bit line is changed during an evaluation operation.

If a selected memory cell is an erase cell having a threshold voltage less than the $0^{th}$ MSB verification voltage MPV0, the even bit line BLe is discharged to 0 V. However, if a selected memory cell is a program cell having a threshold voltage more than the $0^{th}$ MSB verification voltage MPV0, the bit line BLe retains a precharged voltage.

Next, when the sense control signal PBSENSE of a second voltage level V2 is applied, the sense node SO is coupled with the even bit line BLe, leading to the sharing of the voltage level of the sense node SO. In other words, if a selected memory cell is in an erase state, the sense node SO is lowered to be close to 0 V. However, if a selected memory cell is in a program state, the sense node SO maintains a high level state.

After such sharing of the voltage level of the sense node SO, the $0^{th}$ verification operation using the 0th MSB verification voltage MPV0 is performed by applying the LSB reset signal LSBRST of a high level.

A result of the $0^{th}$ verification operation is stored in the first latch unit 124 according to the voltage level of the sense node SO.

The sense node SO is then discharged. In order to perform the first verification operation using the first MSB verification voltage MPV1, the sense node SO is precharged again. Next, the sense control signal PBSENSE of the first voltage level V1 is applied to thereby precharge a bit line.

In the state in which the first MSB verification voltage MPV1 is applied to the selected word line Sel WL, an evaluation operation is performed, and the sense control signal PBSENSE of the second voltage level V2 is then applied, such that the voltage level of the sense node SO is shared.

Next, a result of the first verification is stored in the second latch unit 125 in response to the TDL reset signal TDLRST of a high level.

In such an exemplary double verification operation, two precharge operations, two evaluation operations, and two latch operations must be performed thereby using each of two verification voltages.

As the amount of bit information that can be stored in an MLC and the number of times a double verification operation is performed are increasing, the time that it takes to perform a program verification operation is increased.

To reduce the time that it takes to perform the verification operations, in one or more embodiments of this disclosure, the following double verification operation is performed using the latch circuits shown in FIG. 1C or 1D.

Figure 4:
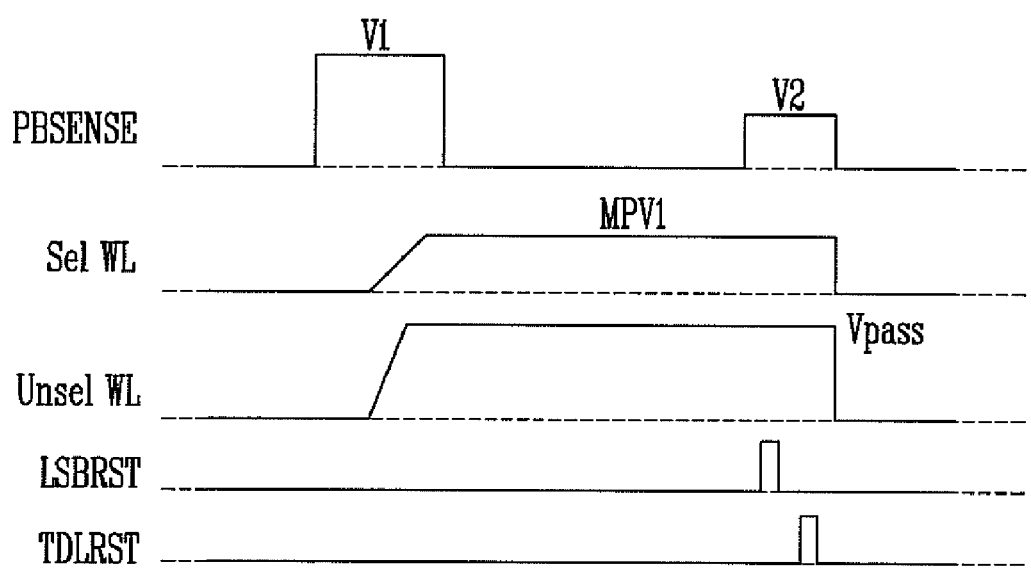
FIG. 4 is a timing diagram illustrating a double verification operation according to an embodiment of the present disclosure.

FIG. 4 is a timing diagram illustrating the double verification operation according to an embodiment of the present disclosure.

Here, only a method of, after completing an LSB page program, performing a double verification operation using the $0^{th}$ and first MSB verification voltages MPV0, MPV1 in relation to the fourth threshold voltage distribution 222 is described with reference to FIG. 4.

To perform the $0^{th}$ and first verification operations respectively using the $0^{th}$ and first MSB verification voltages MPV0, MPV1, the sense node SO is precharged.

Next, the sense control signal PBSENSE of a first voltage level (V1) is applied to thereby precharge a bit line.

Next, the first MSB verification voltage MPV1 is applied to a selected word line Sel WL, a pass voltage Vpass is applied to unselected word lines Unsel WL, and an evaluation operation is performed on the corresponding bit line.

Next, the sense control signal PBSENSE of a second voltage level V2 is applied to the fifth NMOS transistor N5 such that the voltage level of the sense node SO is shared.

In the above case, the voltage level of the sense node SO can be mainly classified into three cases.

The first case corresponds to a page buffer PB coupled to memory cells having threshold voltages less than the $0^{th}$ MSB verification voltage MPV0. The second case corresponds to a page buffer PB coupled to memory cells having threshold voltages, which are greater than the $0^{th}$ MSB verification voltage MPV0, but less than the first MSB verification voltage MPV1.

The third case corresponds to a page buffer PB coupled to memory cells having threshold voltages greater than the first MSB verification voltage MPV1.

In the first case, the voltage level of the sense node SO, which is close to 0 V, is shared. In the second case, the voltage level of the sense node SO, which is greater than 0 V by a small margin, is shared.

In the third case, the voltage level of the sense node SO corresponds to a high level state where such a high level state is rare.

In general, a difference between verification voltages in a double verification operation is about 0.2 V. Thus, the difference in voltage level of the sense node SO in the second and third cases is about 200 mV.

However, a difference between verification voltages in the double verification operation may be small or great depending on setting. Accordingly, a difference in the voltage after sharing the voltage level of the sense node SO can also differ.

In the embodiments of this disclosure, it is assumed that a difference between the $0^{th}$ MSB verification voltage MPV0 and the first MSB verification voltage MPV1 is about 200 mV. Accordingly, the first and second latch units 124, 125 are configured to have different latch trip points.

That is, the latch trip point of the second latch unit 125 is set to about 200 mV higher than that of the first latch unit 124.

After the voltage level of the sense node SO is shared, when data are latched in the first and second latch units 124, 125 at the same time or sequentially, a result of the first verification operation is latched in the first latch unit 124, and a result of the $0^{th}$ verification operation is latched in the second latch unit 125.

This is described in detail below with reference to the first and second embodiments.

Figure 5:
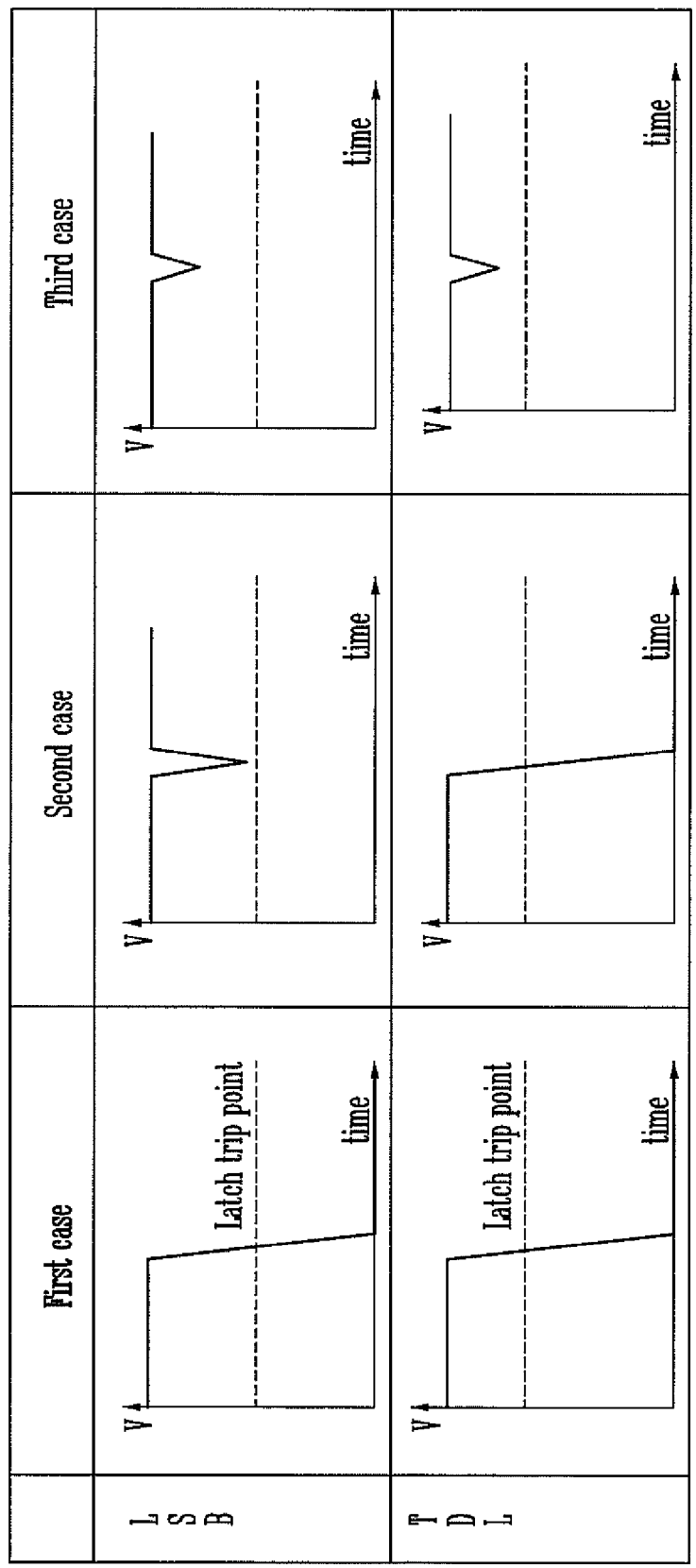
FIG. 5 is a diagram illustrating a change of latch states according to the latch trip points of first and second latch units when a double verification operation is performed.

A difference in the latch trip point between the first and second latch units 124, 125 is illustrated in FIG. 5.

FIG. 5 is a diagram illustrating a change of latch states according to the latch trip points of the first and second latch units when the double verification operation is performed.

Referring to FIG. 5, when the $0^{th}$ and first verification operations are performed as described above, memory cells may belong to any one or more of the first to third cases.

In the first case, there is a change in data stored in the first and second latch units 124, 125 because voltages of the first and second latch units 124, 125 reach a latch trip point.

In the second case, there is no change in data stored in the first latch unit 124 because the voltage of the sense node SO for the first latch unit 124 does not reach a latch trip point. However, data stored in the second latch unit 125 is latched and changed because the latch trip point of the second latch unit 125 is higher than that of the first latch unit 124.

In the third case, data stored in both the first and second latch units 124, 125 are not changed because the voltages of the first and second latch units 124, 125 do not reach a latch trip point.

The operations of the latch trip points of the first and second latch units 124, 125 are described in detail below.

First, in the first embodiment, the voltage level of the sense node SO of a page buffer PB coupled to memory cells corresponding to the first case is almost 0 V. Accordingly, data stored in the first and second latch units 124, 125 are changed because the fourteenth NMOS transistor N14 is barely turned on.

The voltage level of the sense node SO of a page buffer PB coupled to memory cells corresponding to the second case is more than 0 V. Accordingly, the fourteenth NMOS transistor N14 is weakly turned on.

In this state, data stored in the first latch unit 124 are not changed because the first latch unit 124 has a low latch trip point and so is not influenced. However, the latch trip point of the second latch unit 125 is higher than that of the first latch unit 124. In particular, the second latch unit 125 has a high latch trip point corresponding to a difference in the voltage between the $0^{th}$ MSB verification voltage MPV0 and the first MSB verification voltage MPV1.

Accordingly, the fourteenth NMOS transistor N14 is weakly turned on, and data stored in the second latch unit 125 can be changed.

In the third case, since the sense node SO has a high voltage level, data stored in both the first and second latch units 124, 125 are not changed.

Meanwhile, in the second embodiment of the present disclosure, the third and fourth latch units 126, 127 are operated as follows.

First, in the first case, data stored in the third and fourth latch units 126, 127 are changed.

In the second case, the fifteenth NMOS transistor N15 of the third latch unit 126 is not sufficiently turned on in response to a low voltage level of the sense node SO, and therefore, data stored in the third latch unit 126 is not changed.

However, the sixteenth NMOS transistor N16 of the fourth latch unit 127 is sufficiently turned on in response to a low voltage level of the sense node SO. Accordingly, data stored in the fourth latch unit 127 are changed. In the third case, data stored in both the third and fourth latch units 126, 127 are not changed.

As described above, the latch trip points of the third and fourth latch units 126, 127 are properly changed according to a difference in the voltage between verification voltages used in a double verification operation. Accordingly, the time taken for a double verification operation to be executed can be reduced by half because verification results for two verification voltages can be latched while one verification operation is performed. In a similar way, the operation can apply to the page buffer PB, such as that shown in FIG. 1E according to the second embodiment of this disclosure.

To this end, the latch trip point of only one of two or more latch circuits is set to be high. Accordingly, the time taken for a double verification operation to be executed can be reduced while not affecting typical operations, such as program, read, and erase operations.

As described above, in the method of operating the non-volatile memory device according to some embodiments of the present disclosure, when a double verification operation is performed, one bit line is precharged, and two verification operations are performed. Accordingly, the time taken for verification operations to be executed can be reduced, and so the time that it takes to perform a program operation can be reduced.

What is claimed is:

1. A page buffer of a nonvolatile memory device utilizing a double verification method using first and second verification voltages when performing a program verification operation, the page buffer comprising:
   a first latch unit comprising a first latch configured to store input data of a program operation and results of a first verification operation using the first verification voltage; and
   a second latch unit comprising a second latch configured to have a higher latch trip point than the first latch and to store a result of a second verification operation using the second verification voltage, which is less than the first verification voltage, when the first verification operation is performed.

2. The page buffer of claim 1, wherein the first latch unit comprises:
   the first latch configured to comprise first and second inverters respectively having a PMOS transistor and an NMOS transistor having a same channel size between first and second nodes; and
   first and second switching elements configured to select the first node or the second node in order to change data stored in the first latch.

3. The page buffer of claim 2, wherein the second latch unit comprises:
   the second latch configured to comprise third and fourth inverters respectively having a PMOS transistor and an NMOS transistor between third and fourth nodes, wherein the PMOS transistor of the second latch has a same channel size as the PMOS transistor of the first latch, and the NMOS transistor of the second latch has a larger channel size than the PMOS transistor of the second latch; and
   third and fourth switching elements configured to select the third node or the fourth node in order to change data stored in the second latch unit.

4. The page buffer of claim 3, wherein the second latch is configured to have a higher latch trip point than the first latch as high as a voltage level corresponding to a difference between the first verification voltage and the second verification voltage.

5. A page buffer of a nonvolatile memory device utilizing a double verification method using first and second verification voltages when performing a program verification operation, the page buffer comprising:
   a first latch unit, comprising a first latch configured to store data and a first data sense unit turned on or off in response to a voltage level of a sense node which is changed according to a result of a first verification operation using the first verification voltage; and
   a second latch unit, comprising a second latch configured to store data and a second sense unit turned on or off in response to a voltage level of the sense node and operated in response to a lower voltage level than that of the first data sense unit.

6. The page buffer of claim 5, wherein:
   the first and second data sense units comprise first and second NMOS transistors, respectively,
   gates of the first and second NMOS transistors are coupled to the sense node, and
   the second NMOS transistor has a larger channel size than the first NMOS transistor.

7. A method of operating a nonvolatile memory device, the memory device comprising a memory cell array configured to have memory cells coupled together by bit lines and word lines and page buffers coupled to the bit lines, the method comprising:
   performing a program operation on a selected memory cell selected from among the memory cells in response to a program pulse;
   precharging a selected bit line coupled to the selected memory cell;
   applying a first verification voltage to a selected word line coupled to the selected memory cell and changing a voltage of the selected bit line according to a program state of the selected memory cell;
   coupling the selected bit line and a sense node of a page buffer coupled to the selected bit line and changing a voltage level of the sense node according to the voltage of the selected bit line; and
   storing a result of a verification operation using the first verification voltage and a result of a verification operation using a second verification voltage lower than the first verification voltage in first and second latches of a page buffer having first and second latch trip points, respectively, according to the voltage level of the sense node.

8. The method of claim 7, wherein the second latch trip point is higher than the first latch trip point by a difference between the first and second verification voltages.

* * * * *